(12) United States Patent
Chen et al.

(10) Patent No.: US 10,830,831 B2
(45) Date of Patent: Nov. 10, 2020

(54) STATUS DERIVATION OF LOAD CIRCUIT VIA CAPACITANCE

(71) Applicant: SIGNIFY HOLDING B.V., Eindhoven (NL)

(72) Inventors: Hongxin Chen, Shanghai (CN); Hong Chen, Shanghai (CN)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/741,306

(22) PCT Filed: Jun. 17, 2016

(86) PCT No.: PCT/EP2016/063986
§ 371 (c)(1),
(2) Date: Jan. 2, 2018

(87) PCT Pub. No.: WO2017/001211
PCT Pub. Date: Jan. 5, 2017

(65) Prior Publication Data
US 2018/0188333 A1  Jul. 5, 2018

(30) Foreign Application Priority Data

Jun. 30, 2015 (WO) ............... PCT/CN2015/082825
Aug. 13, 2015 (EP) ..................................... 15180858

(51) Int. Cl.
*G01R 31/44* (2020.01)
*G01R 31/50* (2020.01)
(Continued)

(52) U.S. Cl.
CPC ............ *G01R 31/44* (2013.01); *G01R 31/50* (2020.01); *H05B 45/40* (2020.01); *H05B 45/50* (2020.01)

(58) Field of Classification Search
CPC ...... H05B 33/089; G01R 31/024; F21V 25/04
See application file for complete search history.

(56) References Cited

U.S. PATENT DOCUMENTS

2005/0077909 A1* 4/2005 Lalla .................. G01D 5/24
324/658
2008/0069576 A1* 3/2008 Etter .................. G03G 21/12
399/35
(Continued)

FOREIGN PATENT DOCUMENTS

DE  102014112176 A1  3/2015
EP      2244533 A2  10/2010
(Continued)

*Primary Examiner* — Alvaro E Fortich
(74) *Attorney, Agent, or Firm* — Patrick T. Driscoll

(57) ABSTRACT

Apparatuses (10) for determining statuses of load circuits (11) comprise terminals (1, 2) for exchanging current signals with current sources (12). The load circuits (11) comprise D loads ($L_1$-$L_D$) in series combinations coupled to the terminals (1, 2). The apparatuses (10) further comprise capacitance circuits (3) comprising E monitor capacitances ($C_{M1}$-$C_{ME}$) with first contacts coupled to each other and to one of the terminals (1, 2) and second contacts coupled to interconnections between the loads ($L_1$-$L_D$). The apparatuses (10) further comprise detection circuits (4) for detecting voltage signals present between the first and second terminals (1, 2), and derivation circuits (5) for deriving the statuses of the load circuits (11) from the detected voltage signals. Thereto, the derivation circuits (5) may calculate instantaneous capacities comprising steps indicative for said statuses of the load circuits (11). The capacitance circuits (3) do advantageously not interfere with the load circuits (11) in steady-states, and may further comprise F parallel capacitances ($C_{P1}$-$C_{FP}$) in parallel to the loads ($L_1$-$L_D$).

28 Claims, 5 Drawing Sheets

(51) Int. Cl.
*H05B 45/40* (2020.01)
*H05B 45/50* (2020.01)

(56) References Cited

U.S. PATENT DOCUMENTS

| | | | | |
|---|---|---|---|---|
| 2010/0060175 A1* | 3/2010 | Lethellier | .......... | H05B 33/0815 |
| | | | | 315/164 |
| 2010/0149458 A1* | 6/2010 | Nam | .................... | H05B 41/282 |
| | | | | 349/70 |
| 2010/0264828 A1* | 10/2010 | Cortigiani | ............... | H05B 45/50 |
| | | | | 315/130 |
| 2010/0270935 A1* | 10/2010 | Otake | ................ | H05B 33/0803 |
| | | | | 315/185 R |
| 2013/0002140 A1 | 1/2013 | Serebryanov et al. | | |
| 2013/0113394 A1* | 5/2013 | Ido | ......................... | H05B 45/50 |
| | | | | 315/297 |
| 2013/0241417 A1* | 9/2013 | Sakuma | ................. | H05B 47/22 |
| | | | | 315/131 |
| 2013/0278138 A1* | 10/2013 | Yagi | .................... | H05B 33/0821 |
| | | | | 315/71 |
| 2014/0285021 A1* | 9/2014 | Yamagishi | ............. | H03K 4/023 |
| | | | | 307/52 |
| 2014/0300274 A1* | 10/2014 | Acatrinei | ........... | H05B 33/0815 |
| | | | | 315/85 |
| 2015/0070311 A1* | 3/2015 | Caldwell | ................ | G06F 3/0416 |
| | | | | 345/174 |
| 2017/0215248 A1* | 7/2017 | Regau | ................. | H05B 33/083 |

FOREIGN PATENT DOCUMENTS

JP          2015118861 A      6/2015
WO      2011158196 A1     12/2011

* cited by examiner

US 10,830,831 B2

STATUS DERIVATION OF LOAD CIRCUIT VIA CAPACITANCE

CROSS-REFERENCE TO PRIOR APPLICATIONS

This application is the U.S. National Phase application under 35 U.S.C. § 371 of International Application No. PCT/EP2016/063986, filed on Jun. 17, 2016, which claims the benefit of International Application No. PCT/CN2015/082825, filed on Jun. 30, 2015 and European Patent Application No. 15180858.1, filed on Aug. 13, 2015. These applications are hereby incorporated by reference herein.

FIELD OF THE INVENTION

The invention relates to an apparatus for determining a status of a load circuit. The invention further relates to a device comprising the apparatus and the load circuit. Examples of such a device are consumer products, such as for example consumer lamps, and professional products, such as for example professional lamps.

BACKGROUND OF THE INVENTION

US 2010/0264828 discloses a failure detection for series of electrical loads. Thereto, an evaluation unit evaluates a voltage drop present across all loads and a partial voltage drop present across only some of the loads.

SUMMARY OF THE INVENTION

It is an object of the invention to provide an improved apparatus. It is a further object of the invention to provide a device.

According to a first aspect, an apparatus is provided for determining a status of a load circuit, which load circuit comprises at least D loads in a series combination, the apparatus comprising
 a first terminal configured to receive a current signal from a current source and a second terminal configured to guide the current signal back to the current source, the series combination being configured to be coupled to the first and second terminals,
 a capacitance circuit comprising at least E monitor capacitances, wherein first contacts of the monitor capacitances are coupled to a same one of the terminals, and second contacts of the respective monitor capacitances are configured to be coupled to respective interconnections between the loads,
 a detection circuit configured to detect a voltage signal present between the first and second terminals in a time interval, and
 a derivation circuit configured to derive the status of the load circuit from the detected voltage signal in said time interval.

By observing the waveform of voltage signal across the whole load in a time interval, status of loads could be determined. In one embodiment, the time interval starts from a first moment of starting to receive the current signal from the current source and ends at a second moment of current going through all loads is stable. The start point and the ending point of the time interval could also be varied, as long as it locates in a time window between the first moment and the second moment, depending on status of which part of loads is interested. By observing the waveform of voltage signal across the whole load in a time interval, status of loads could be determined.

In an embodiment, the current will be increased from zero when the loads start to receive current from current sources then decrease to zero if one of the loads is open. The steady-state current going through loads is zero.

In another embodiment, if a load is short, other loads is in good condition, the steady-state current going through all loads would be the output current of the current source.

In an embodiment, the time interval could be a fix time during starting from the first moment, e.g. dozens of milliseconds after the first moment, depends on the specific circuits response time.

An apparatus is configured to determine a status of a load circuit. This load circuit comprises at least D loads in a series combination. The apparatus comprises a first terminal configured to receive a current signal from a current source and a second terminal configured to guide the current signal back to the current source. The series combination is configured to be coupled to the first and second terminals for receiving and guiding back said current signal. Thereto, a first contact of a first load is to be coupled to the first terminal, a second contact of the first load is to be coupled to a first contact of a second load, a second contact of the second load is to be coupled to a first contact of a third load . . . etc. . . . a second contact of a one-but-last load is to be coupled to a first contact of a last load, and a second contact of the last load is to be coupled to the second terminal. This way, power is provided from the current source via the first and second terminals to the load circuit, and the load circuit is fed.

The apparatus comprises a capacitance circuit that comprises at least E monitor capacitances. First contacts of the monitor capacitances are coupled to each other and to one of the terminals, such as for example the second terminal. Second contacts of the respective monitor capacitances are configured to be coupled to respective interconnections between the loads. Thereto, a second contact of a first monitor capacitance is to be coupled to the second contact of the first load (and to the first contact of the second load), a second contact of a second monitor capacitance is to be coupled to the second contact of the second load (and to the first contact of the third load) . . . etc . . . and a second contact of a last monitor capacitance is to be coupled to the second contact of the one-but-last load (and to the first contact of the last load).

The apparatus comprises a detection circuit configured to detect a voltage signal present between the first and second terminals, and comprises a derivation circuit configured to derive a status of the load circuit from the detected voltage signal.

Starting with all capacitances being discharged, as soon as the current signal is supplied to the first terminal, firstly the first load will be activated, then secondly the second load will be activated . . . etc. . . . and finally the last load will be activated. The reason for this is that the first monitor capacitance needs to be charged to a sufficient extent before the second load is activated, the second monitor capacitance needs to be charged to a sufficient extent before the third load is activated . . . etc. . . . and the last monitor capacitance needs to be charged to a sufficient extent before the last load is activated.

During the activations of the loads, the voltage signal present between the first and second terminals will rise from a zero value to a final value. The way this voltage signal rises will be an indication for a status of the load circuit. In case a load is not ok, for example owing to the fact that a load is an "open" or a "short", the voltage signal will rise differently compared to a situation wherein all loads are ok. As a result, an apparatus has been created, which apparatus allows a status of a load circuit to be determined via monitor capacitances. Contrary to US 2010/0264828, that has a failure detection that interferes with the load circuit all the time, the monitor capacitances will stop interfering with the load circuit once all capacitances have been charged to a final extent. This lack of steady-state-interference is a great technical advantage.

Usually, in case there are D loads in a series combination, there are E=D−1 monitor capacitances, owing to the fact that the second contacts of the respective monitor capacitances are coupled to respective interconnections between the loads, and D loads in a series combination will have D−1 interconnections. But other values of E are not to be excluded.

An embodiment of the apparatus is defined, wherein the status of the load circuit comprises a status of at least one load. In a minimum situation, the status of the load circuit comprises a status of one load. In an extended situation, the status of the load circuit comprises statuses of several loads. In a maximum situation, the status of the load circuit comprises statuses of all loads, i.e. status of each load. In other words, our invention could not only detect problems of a load but also locate where the load with problem is.

An embodiment of the apparatus is defined, wherein the status of the at least one load comprises a normal status or a failure status. A normal status may for example correspond with the at least one load showing a normal impedance. A failure status may for example correspond with the at least one load showing a failure impedance.

An embodiment of the apparatus is defined, wherein the normal status defines that the at least one load shows an impedance value between a lower threshold value and an upper threshold value, and the failure status defines that the at least one load shows an impedance value smaller than the lower threshold value or larger than the upper threshold value. A normal impedance may be situated between a lower threshold value and an upper threshold value, while including or excluding these threshold values. A failure impedance may be situated below the lower threshold value or above the upper threshold value.

An embodiment of the apparatus is defined, wherein D≥2, and E=D−1. In a minimum situation, there will be two loads and one monitor capacitance. In an extended situation, there may be more loads and capacitances. Usually and preferably, there will be three loads and two monitor capacitances, or more. Here, it must be noted that a load may comprise two or more sub-loads, and that different loads may comprise different numbers of sub-loads. D is usually a positive integer.

An embodiment of the apparatus is defined, wherein the capacitance circuit further comprises at least F parallel capacitances, and wherein the respective parallel capacitances are configured to be in parallel with the respective loads. Thereto, a first parallel capacitance is to be coupled in parallel to the first load, a second parallel capacitance is to be coupled in parallel to the second load . . . etc. . . . and a last parallel capacitance is to be coupled in parallel to the last load. Such parallel capacitances protect the loads against voltage spikes. WO 2011/158196 discloses such parallel capacitances.

An embodiment of the apparatus is defined, wherein D≥2, E=D−1, and F=D. In a minimum situation, there will be two loads and one monitor capacitance and two parallel capacitances. In an extended situation, there may be more loads and capacitances. Usually and preferably, there will be three loads and two monitor capacitances and three parallel capacitances, or more. Further, it must be noted that the last monitor capacitance and the last parallel capacitance may coincide, or not. D is usually a positive integer.

An embodiment of the apparatus is defined, wherein the derivation circuit is configured to compare the detected voltage signal with a predefined voltage signal and to determine the status of the load circuit from a difference or differences between these voltage signals.

According to a first option, the status of the load circuit is determined from a difference or differences between the detected voltage signal and a predefined voltage signal. This predefined voltage signal may for example be a previously calculated and stored voltage signal or a previously estimated and stored voltage signal or a previously detected and stored voltage signal.

An embodiment of the apparatus is defined, wherein the derivation circuit is configured to calculate an instantaneous capacity of a combination of the capacitance circuit and the load circuit and to determine the status of the load circuit from a size of a step or sizes of steps in the calculated instantaneous capacity.

According to a second option, the status of the load circuit is determined from a size of a step or sizes of steps in a calculated instantaneous capacity of a combination of the capacitance circuit and the load circuit. The instantaneous capacity of this combination of the capacitance circuit and the load circuit can be calculated by using the equation I=C dV/dt. Given a value of the current signal I and values of the voltage signal V per time t, a value of the instantaneous capacity C per time t can be determined. Starting with all capacitances being discharged, as soon as the current signal is supplied to the first terminal, firstly, at the moment of switching, all capacitances will be a "short" and the value of the instantaneous capacity will be zero. Then, the capacitances will be charged, whereby capacitances located closer to the first terminal will be charged before capacitances located closer to the second terminal are charged. During the charging, the value of the instantaneous capacity will rise from a zero value to a final value. The way this value rises will be an indication for a status of the load circuit. In case a load is not ok, for example owing to the fact that a load is "open" or "short", the value will rise differently compared to a situation wherein all loads are ok.

Both options are available for a capacitance circuit comprising only monitor capacitances and for a capacitance circuit comprising monitor capacitances as well as parallel capacitances.

An embodiment of the apparatus is defined, wherein the monitor capacitances have similar values. Preferably, the monitor capacitances have similar values, whereby first and second monitor capacitances have similar values in case a first value of the first monitor capacitance is between 50% and 150% of a second value of the second monitor capacitance, preferably between 75% and 125%, more preferably between 90% and 110%. In a preferred embodiment, the monitor capacitances have substantially same values.

An embodiment of the apparatus is defined, wherein the parallel capacitances have similar values. Preferably, the parallel capacitances have similar values, whereby first and second parallel capacitances have similar values in case a first value of the first parallel capacitance is between 50% and 150% of a second value of the second parallel capacitance, preferably between 75% and 125%, more preferably between 90% and 110%. In a preferred embodiment, the parallel capacitances have substantially same values.

Preferably, the monitor capacitances and the parallel capacitances have similar values too.

An embodiment of the apparatus is defined, wherein the apparatus further comprises the current source.

An embodiment of the apparatus is defined, wherein the current signal is configured to have a substantially constant value. A current signal having a substantially constant value has an instantaneous value between 50% and 150% of an average value of the current signal, preferably between 75% and 125%, more preferably between 90% and 110%.

According to a second aspect, a device is provided comprising the apparatus and further comprising the load circuit. Examples of such a load circuit are series combinations of diode-arrangements and series combinations of rectifier-arrangements.

An embodiment of the device is defined, wherein each load comprises a light emitting diode circuit. A light emitting diode circuit comprises one or more light emitting diodes of whatever kind and in whatever combination.

A basic idea is that a capacitance circuit comprising at least E monitor capacitances coupled to each other and to be coupled to respective interconnections between serial loads is to be introduced, and that a detection circuit for detecting a voltage signal and a derivation circuit for deriving a status of the load circuit from the detected voltage signal are to be introduced, to determine a status of a load circuit without steady-state-interference.

A problem to provide an improved apparatus has been solved. A further advantage is that the apparatus is simple, low cost and robust.

These and other aspects of the invention will be apparent from and elucidated with reference to the embodiments described hereinafter.

DETAILED DESCRIPTION OF EMBODIMENTS

Figure 1:
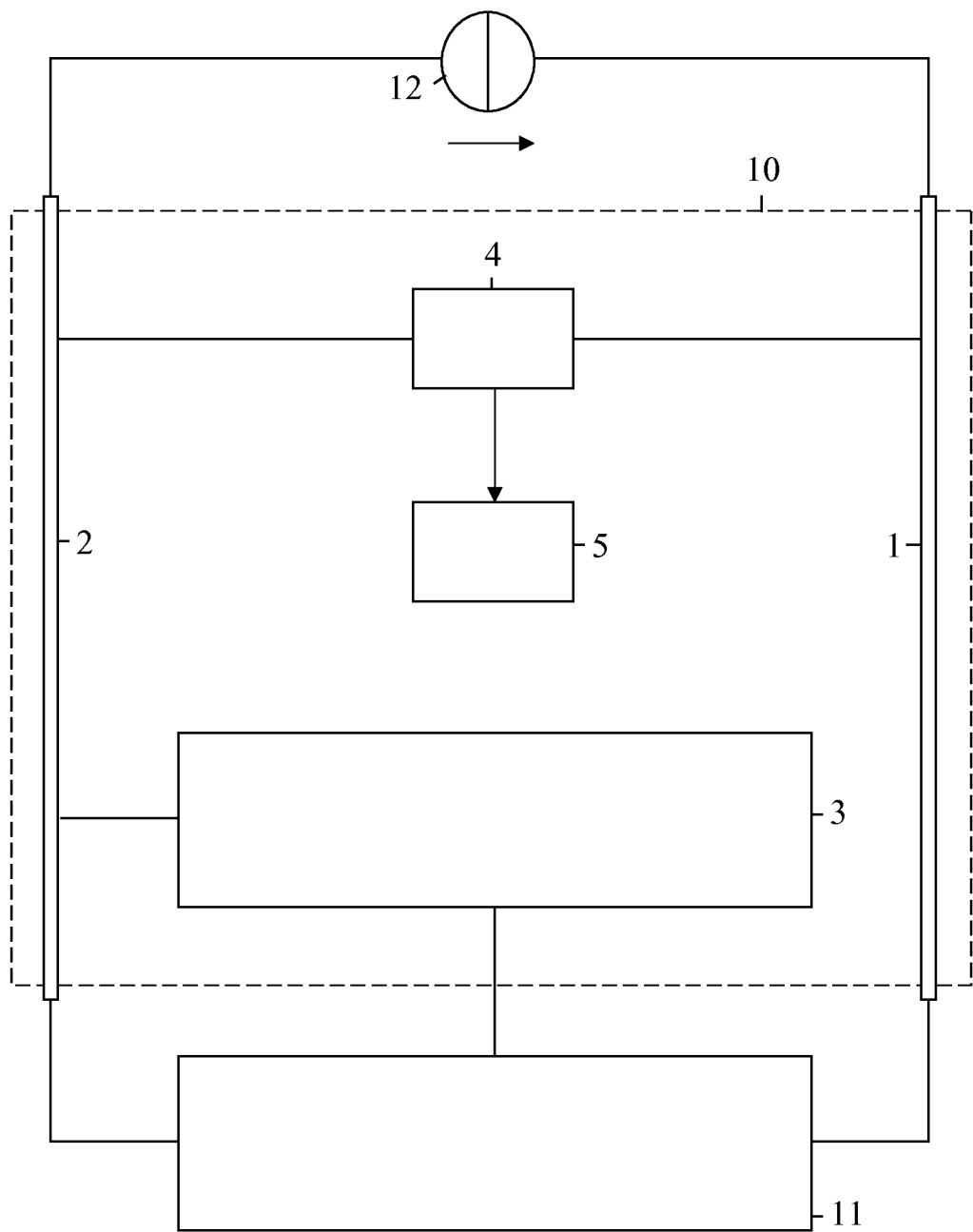
FIG. 1 shows an embodiment of an apparatus.

In the FIG. 1, an embodiment of an apparatus is shown. The apparatus 1 is configured to determine a status of a load circuit 11. The apparatus 10 comprises a first terminal 1 for receiving a current signal from a current source 12 and a second terminal 2 for guiding the current signal back to the current source 12. The load circuit 11 is configured to be coupled to the first and second terminals 1, 2.

The apparatus 10 further comprises a capacitance circuit 3 coupled to one of the terminals 1, 2 and to the load circuit 11, a detection circuit 4 coupled to the terminals 1, 2 and configured to detect a voltage signal present between the first and second terminals 1, 2, and a derivation circuit 5 coupled to the detection circuit 4 and configured to derive the status of the load circuit 11 from the detected voltage signal.

Figure 2:
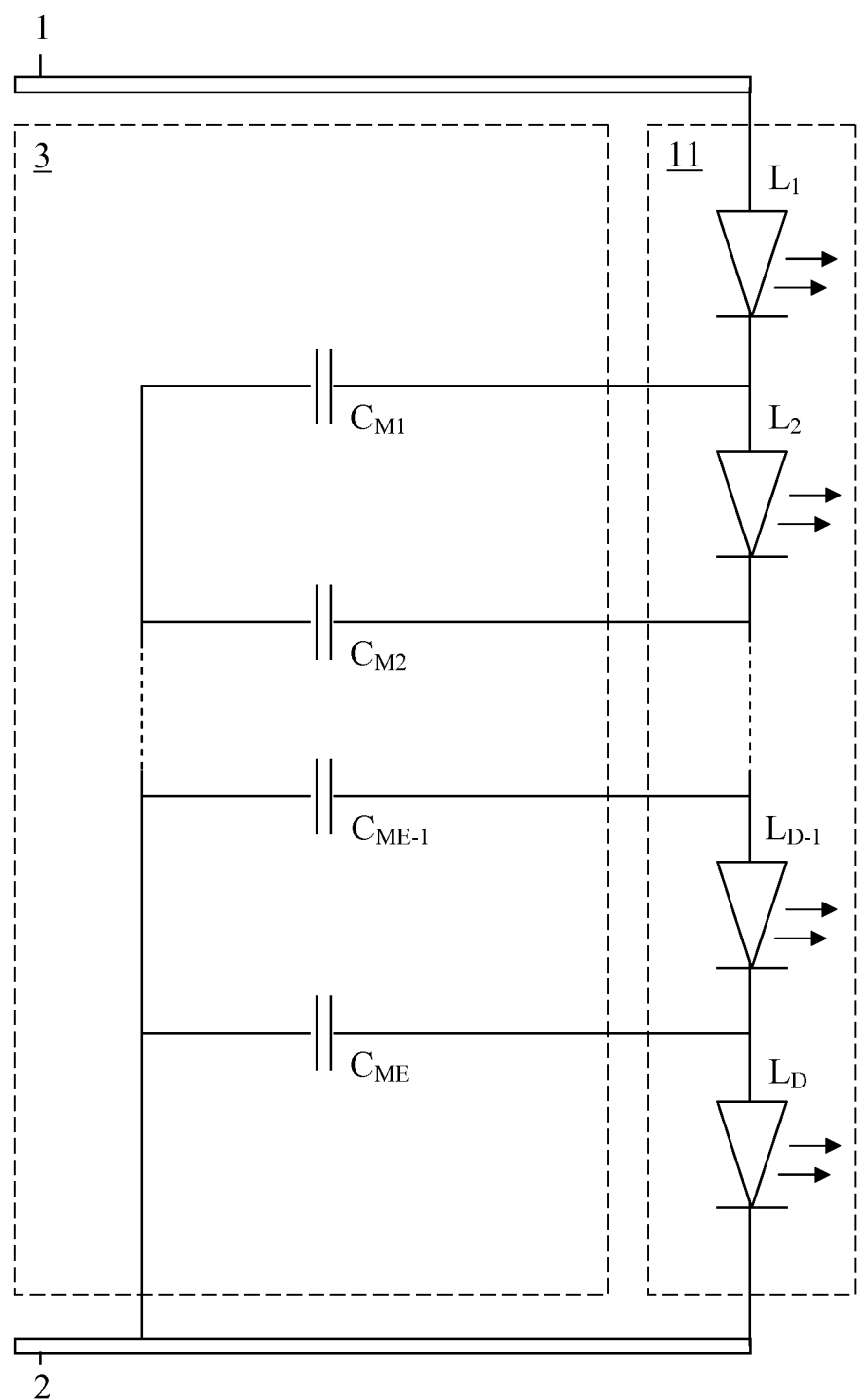
FIG. 2 shows a first embodiment of a capacitance circuit.

In the FIG. 2, a first embodiment of a capacitance circuit is shown. Further shown is an embodiment of the load circuit 11, that comprises at least D loads $L_1$-$L_D$ in a series combination. The capacitance circuit 3 comprises at least E monitor capacitances $C_{M1}$-$C_{ME}$. First contacts of the monitor capacitances $C_{M1}$-$C_{ME}$ are coupled to the second terminal 2 for the given direction of the current signal when having a positive value as shown in the FIG. 1. In case of this current signal having a negative value, the first contacts of the monitor capacitances $C_{M1}$-$C_{ME}$ are to be coupled to the first terminal 1 and the series combination is to be reversed. Second contacts of the respective monitor capacitances $C_{M1}$-$C_{ME}$ are coupled to respective interconnections between the loads $L_1$-$L_D$. Usually, E=D−1, but other values of E are not to be excluded, for example smaller values in case one or more interconnections are not used or larger values in case one or more interconnections are used more than once.

Figure 3:
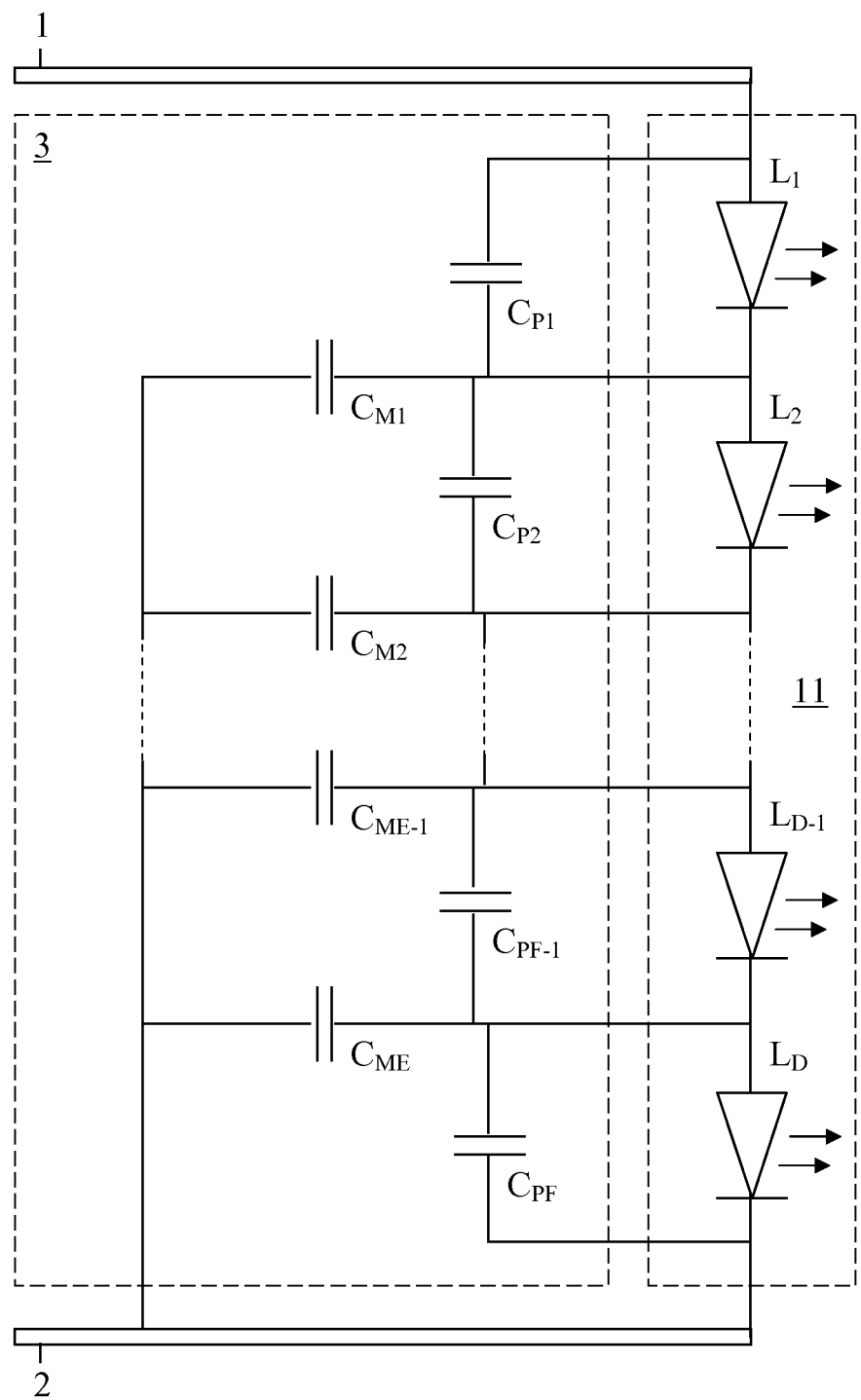
FIG. 3 shows a second embodiment of a capacitance circuit.

In the FIG. 3, a second embodiment of a capacitance circuit is shown. The second embodiment of the capacitance circuit 3 differs from the first embodiment of the capacitance circuit 3 shown in the FIG. 2 in that it further comprises at least F parallel capacitances $C_{P1}$-$C_{PF}$. These respective parallel capacitances $C_{P1}$-$C_{PF}$ are coupled in parallel with the respective loads $L_1$-$L_D$. Usually, F=D, but other values of F are not to be excluded, for example smaller values in case one or more of the parallel capacitances $C_{P1}$-$C_{PF}$ are left out or larger values in case a load $L_1$-$L_D$ is given two or more parallel capacitances.

The apparatus 1 is configured to determine a status of a load circuit 11. The status of the load circuit 11 may comprise a status of at least one load $L_1$-$L_D$. The status of the at least one load $L_1$-$L_D$ may comprise a normal status or a failure status. The normal status may define that the at least one load $L_1$-$L_D$ shows an impedance value between a lower threshold value and an upper threshold value, and the failure status may define that the at least one load $L_1$-$L_D$ shows an impedance value smaller than the lower threshold value or larger than the upper threshold value. D≥2, E=D−1, and F=D. Preferably, D≥3.

The monitor capacitances $C_{M1}$-$C_{ME}$ may have similar values, and the parallel capacitances $C_{P1}$-$C_{PF}$ may have similar values, in a simple implementation. A possible value for each one of the monitor capacitances and the parallel capacitances might be 1 µF, without having excluded other values.

The apparatus 10 may further comprises the current source 12, and the current signal may have a substantially constant value, in a simple implementation. A possible value for the current signal might be 0.1 mA, without having excluded other values.

A device such as a consumer product or a professional product may comprise the apparatus 10 and may further comprise the load circuit 11. Each load $L_1$-$L_D$ of the load circuit 11 may comprise a light emitting diode circuit, without having excluded other kinds of loads.

The derivation circuit 5 may be configured to compare the detected voltage signal with a predefined voltage signal and to determine the status of the load circuit 11 from a difference or differences between these voltage signals. Alternatively, the derivation circuit 5 may be configured to calculate an instantaneous capacity of a combination of the capacitance circuit 3 and the load circuit 11 and to determine the status of the load circuit 11 from a size of a step or sizes of steps in the calculated instantaneous capacity, as is shown in the FIG. 4-7, for the second embodiment of the capacitance circuit 3 shown in the FIG. 3, and for D=12, E=11, and F=12.

Figure 4:
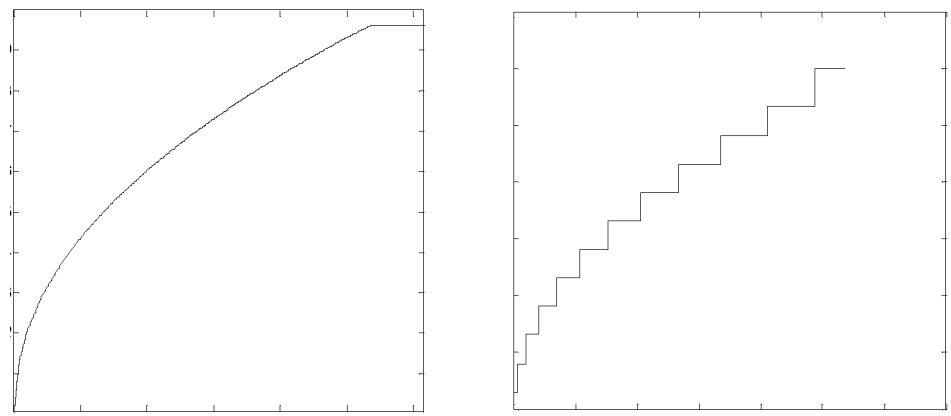
FIG. 4 shows a first voltage signal and a first instantaneous capacity.

In the FIG. 4, a first voltage signal (left graph: horizontal axis: time; vertical axis: voltage) and a first instantaneous capacity (right graph: horizontal axis: time; vertical axis: capacity) are shown. The voltage signal has been detected, and the instantaneous capacity has been calculated by having used I=C dV/dt. Given a value of the current signal I and values of the voltage signal V per time t, a value of the instantaneous capacity C per time t can be determined.

Starting with all capacitances $C_{M1}$-$C_{M11}$ and $C_{P1}$-$C_{P12}$ being discharged, at a first moment of starting to supply the current signal to the first terminal 1, each capacitance $C_{M1}$-$C_{M11}$ and $C_{P1}$-$C_{P12}$ will be a short-circuit, and no load $L_1$-$L_{12}$ is activated. Firstly, the first parallel capacitance $C_{P1}$ is charged, via the remaining capacitances (the lower capacitances in the FIG. 3). As soon as the first parallel capacitance $C_{P1}$ has been charged to a sufficient extent, the first load $L_1$ will be activated. Then, the second parallel capacitance $C_{P2}$ is charged, via the remaining capacitances (the lower capacitances in the FIG. 3). As soon as the second parallel capacitance $C_{P2}$ has been charged to a sufficient extent, the second load $L_2$ will be activated etc. Finally, the twelfth load $L_{12}$ will be activated.

In case of the load is a LED chip, the LED chip is activated means the LED chip reaches its forward turn-on voltage.

During the activations of the loads $L_1$-$L_{12}$, the voltage signal present between the first and second terminals 1, 2 will rise from a zero value to a final value, as shown in the FIG. 4. The way this voltage signal rises will be an indication for the status of the load circuit 11. In case a load $L_1$-$L_{12}$ is not ok, for example owing to the fact that a load is an "open" (too high impedance value) or a "short" (too low impedance value), the voltage signal will rise differently compared to a situation wherein all loads are ok. In the FIG. 4, all loads $L_1$-$L_{12}$ are ok. As a result, the calculated instantaneous capacity as shown in the FIG. 4 shows twelve times a vertical jump followed by a horizontal level, in other words, twelve steps. Note that two neighboring vertical jumps are relatively similar for all the steps and that two neighboring horizontal levels are relatively similar for all the steps.

Figure 5:
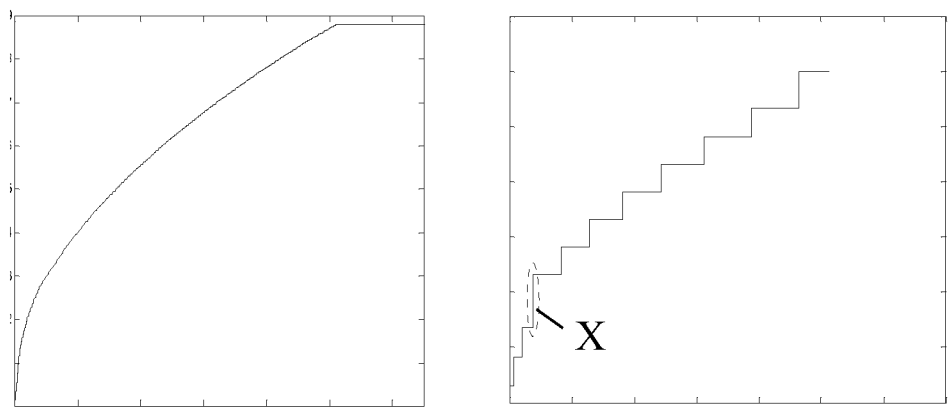
FIG. 5 shows a second voltage signal and a second instantaneous capacity.

In the FIG. 5, a second voltage signal (left graph: horizontal axis: time; vertical axis: voltage) and a second instantaneous capacity (right graph: horizontal axis: time; vertical axis: capacity) are shown. This time, there are only eleven steps visible, and the fourth step comprises a vertical jump (indicated by X) that is about twice as large as the previous vertical jump. This is a clear indication that the fourth load $L_4$ is a "short".

Figure 6:
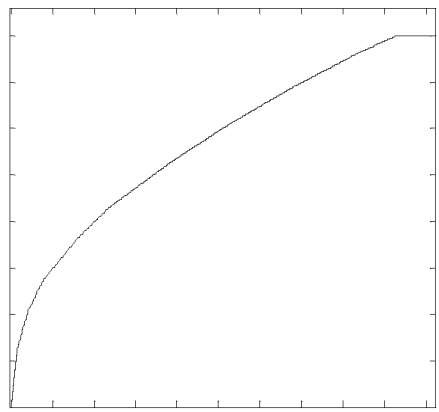
FIG. 6 shows a third voltage signal and a third instantaneous capacity.
Figure 6:
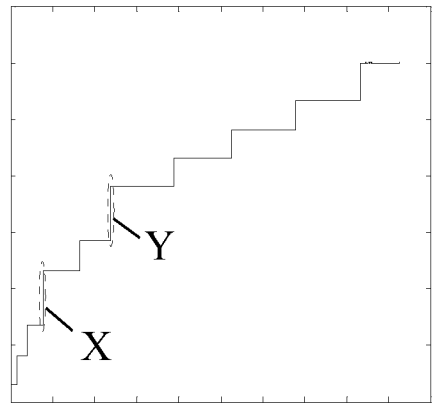

In the FIG. 6, a third voltage signal (left graph: horizontal axis: time; vertical axis: voltage) and a third instantaneous capacity (right graph: horizontal axis: time; vertical axis: capacity) are shown. This time, there are only ten steps visible, and the fourth and sixth steps each comprise a vertical jump (indicated by X and Y) that is about twice as large as their previous vertical jumps. This is a clear indication that the fourth load $L_4$ and the seventh load $L_7$ are a "short" (the seventh load is a "short" owing to the fact that the fourth step of the visible ten steps comprises two normal steps, so the fact that the sixth step of the visible ten steps comprises two normal steps is related to the seventh load $L_7$.

Figure 7:
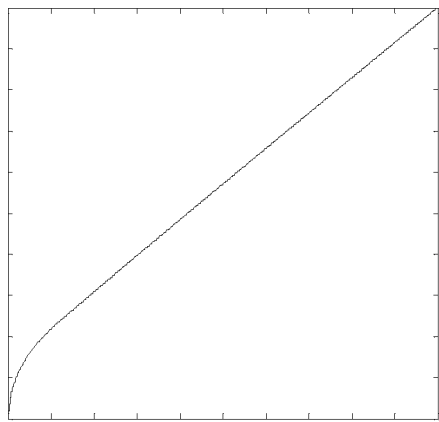
FIG. 7 shows a fourth voltage signal and a fourth instantaneous capacity.
Figure 7:
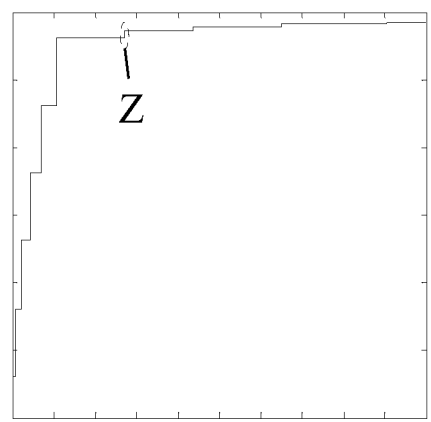

In the FIG. 7, a fourth voltage signal (left graph: horizontal axis: time; vertical axis: voltage) and a fourth instantaneous capacity (right graph: horizontal axis: time; vertical axis: capacity) are shown. This time, there are only six normal steps visible, and the seventh step comprises a vertical jump (indicated by Z) that is much smaller than the previous vertical jump. This is a clear indication that the sixth load $L_6$ is an "open".

So, by detecting the voltage signal between the first and second terminals 1, 2, and by calculating the instantaneous capacity, and by examining the vertical jumps of the calculated instantaneous capacity, a status of the load circuit 11 can be derived. Said examining may for example comprise a calculation of a threshold jump, for example by calculating an average value of all vertical jumps in a situation wherein all loads $L_1$-$L_D$ are ok, and may for example comprise a comparison of each vertical jump with this threshold jump. When being smaller than the threshold jump by a first minimal amount or when being larger than the threshold jump by a second minimal amount, at least one of the loads is not ok. A location of the vertical jump having a too small or too large value will be indicative for the load $L_1$-$L_D$ that is not ok.

A similar explanation can be given when calculating an instantaneous capacity of a combination of the capacitance circuit 3 and the load circuit 11 and determining a status of the load circuit 11 from a size of a step or sizes of steps in the calculated instantaneous capacity, for the first embodiment of the capacitance circuit 3 shown in the FIG. 2. This first embodiment shown in the FIG. 2 is advantageous in that it requires fewer components. The second embodiment shown in the FIG. 3 is advantageous in that the monitor capacitances $C_{M1}$-$C_{ME}$ in a situation with a switched-off current signal and de-activated loads $L_1$-$L_D$ are faster discharged via the parallel capacitances $C_{P1}$-$C_{PF}$ and in that the parallel capacitances $C_{P1}$-$C_{PF}$ protect the loads $L_1$-$L_D$ against voltage spikes.

Alternatively, the detected voltage signal may be compared with a predefined voltage signal, such as for example be a previously calculated voltage signal or a previously estimated voltage signal or a previously detected voltage signal. The status of the load circuit 11 may then be determined from a difference or differences between the detected voltage signal and the predefined voltage signal.

The loads $L_1$-$L_D$ can be coupled serially to each other indirectly via one or more intermediate elements and can be coupled serially to each other directly without the one or more intermediate elements being in between.

The detection circuit 4 may for example comprise an analog voltage detector followed by an analog-to-digital converter or an analog-to-digital converter followed by a digital voltage detector etc. The derivation circuit 5 may for example comprise a processor etc. This all without having excluded other implementations. Each capacitance $C_{M1}$-$C_{ME}$ and $C_{P1}$-$C_{PF}$ may be realized through one capacitor of whatever kind or through two or more capacitors of whatever kind and in whatever serial and/or parallel combination.

Theoretical calculation information: Suppose a parallel capacitor coupled to a load $L_i$ is $C_i$, a total capacitance at its upper side is $C_j$ and a total capacitance at its lower side is $C_k$ (in the FIG. 3). Before a current is flowing through $L_i$, a total capacitance is $C_j+C_i\ C_k/(C_i+C_k)$. Then when a voltage on $C_i$ reaches a forward turn-on voltage of $L_i$, $C_i$ will be shorted by $L_i$. Suppose $C_k$ is further composed of a monitor part $C_m$, a parallel part $C_o$ and a (lower situated) rest part $C_n$. Then after $C_i$ is shorted by $L_i$, a total capacitance will become $C_j+C_m+C_n\ C_o/(C_n+C_o)$. That means that after a voltage on $C_i$ has reached a forward turn-on voltage of $L_i$, a capacitance is increased by $C_j+C_m+C_nC_o/(C_n+C_o)-(C_j+C_i\ C_k/(C_i+C_k))=C_m+C_nC_o/(C_n+C_o)-C_i\ C_k/(C_iC_k)$. A value of $C_n$ will be close to a value of $C_k$ and a value of $C_i$ will be close to a value of $C_o$. In that case, said increase of the capacitance becomes Cm. Thus, in case each capacitor has about a same value, an instantaneous capacity will increase for approximately a same value while accompanying the loads $L_i$ starting to conduct.

Theoretical monitor information: A voltage change is to be monitored between the terminals 1 and 2 as U(t). A capacitance change is to be calculated as C(t)=I/U(t). From C(t), the steps as shown in the FIGS. 4-7 can be found. Define the step i as $S_i$. And define the capacitance at step i as $C_i$. Calculate the relative capacitance increasing for each step as $\Delta C_i = C_i - C_{i-1}$ with i=1, 2, 3 and $C_0=0$. At the beginning when there is no failure, the capacitors are charged and a capacitance increase $\Delta C_i$ is calculated. Then, a mean or median value thereof is to be calculated $C_{mean}$. Given a threshold $k_1$ $C_{mean} \leq k_1 \leq 1$, if $\Delta C_i < k_1 C_{mean}$, the load i has an open circuit issue. Given a threshold $k_2$ $C_{mean}$, $1 \leq k_2 \leq 2$, in case one $\Delta C_i$ is found satisfying $\Delta C_i > k_2 C_{mean}$, the load i+1 has a short circuit issue. If there are more than one $\Delta C_i$ satisfying $\Delta C_i > k_2 C_{mean}$, define a minimum value of i as $i_1$, then the load $i_1+1$ has a short circuit issue. Then find the second minimum value of i as $i_2$, then the load $i_2+2$ has a short circuit issue. And in this analogy, $j^{th}$ minimum value of i as $i_j$, then the load $i_j+j$ has a short circuit issue. If $\Delta C_i$ does not satisfy the upper mentioned conditions, that means there is no failure.

It could be seen that, in case of a load is a LED chip, each LED chip's forward turn-on voltage could be monitored. If this voltage of some chip changes, that means there is degradation of that chip.

Besides the monitoring stage, in normal working stage, since the power is DC current source, there is no current passing these capacitors. Thus, we can skip the capacitors, which have no impact on the LED chips.

The current source for charging could just be the LED driver, preferably, it can provide constant current.

It should be noted that different values of monitor capacitances or parallel capacitances are also workable, which will result in different slopes and different step lengths in two figures respectively in FIG. 4 to FIG. 7. In this scenario, a capacitance curve or voltage signal when all the loads are in normal status could be pre-stored as a reference for the derivation circuit to derive the status of the loads later.

Summarizing, apparatuses 10 for determining statuses of load circuits 11 comprise terminals 1, 2 for exchanging current signals with current sources 12. The load circuits 11 comprise D loads $L_1$-$L_D$ in series combinations coupled to the terminals 1, 2. The apparatuses 10 further comprise capacitance circuits 3 comprising E monitor capacitances $C_{M1}$-$C_{ME}$ with first contacts coupled to each other and to one of the terminals 1, 2 and second contacts coupled to interconnections between the loads $L_1$-$L_D$. The apparatuses 10 further comprise detection circuits 4 for detecting voltage signals present between the first and second terminals 1, 2, and derivation circuits 5 for deriving the statuses of the load circuits 11 from the detected voltage signals. Thereto, the derivation circuits 5 may calculate instantaneous capacities comprising steps indicative for said statuses of the load circuits 11. The capacitance circuits 3 do advantageously not interfere with the load circuits 11 in steady-states, and may further comprise F parallel capacitances $C_{P1}$-$C_{PF}$ in parallel to the loads $L_1$-$L_D$.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An apparatus for determining a status of a load circuit, which load circuit comprises at least D number of loads in a series combination, the apparatus comprising:
   a first terminal configured to receive a current signal from a current source;
   a second terminal configured to guide the current signal back to the current source, the first and second terminals being configured to be coupled to the load circuit;
   a capacitance circuit comprising a first set of capacitors having at least E number of capacitors each having first and second contacts, wherein the first contacts of the first set of capacitors are coupled to a same one of the first and second terminals, and the second contacts of the first set of capacitors are configured to be coupled to respective interconnections between the at least D number of loads;
   a detection circuit configured to detect a voltage signal present between the first and second terminals in a time interval;
   a derivation circuit configured to calculate, based at least on the detected voltage signal and the time interval, a capacitance of the load circuit in combination with the capacitance circuit, and to derive the status of the load circuit based at least on the calculated capacitance;
   wherein the derivation circuit is configured to derive the status of the load circuit based at least on the calculated capacitance by determining a size of a step or sizes of steps in the calculated capacitance over time; and
   wherein when the size of the step or sizes of steps in the calculated capacitance over time is smaller than a threshold jump by a first minimal amount or larger than the threshold jump by a second minimal amount, then the derivation circuit is configured to derive the status of the load circuit as being a failure status.

2. The apparatus as defined in claim 1, wherein the status of the load circuit comprises a status of at least one load from the at least D number of loads, the status of the at least one load comprising a normal status or the failure status.

3. The apparatus as defined in claim 2, wherein the normal status defines that the at least one load has an impedance value between a lower threshold value and an upper threshold value, and the failure status defines that the at least one load has an impedance value smaller than the lower threshold value or larger than the upper threshold value.

4. The apparatus as defined in claim 1, wherein the number of loads D is greater than or equal to 2, and the number of capacitors E in the first set of capacitors is equal to D−1.

5. The apparatus as defined in claim 1, wherein the capacitance circuit further comprises a second set of capacitors having at least F number of capacitors, and wherein the capacitors in the second set of capacitors are configured to be in parallel with respective loads in the at least D number of loads.

6. The apparatus as defined in claim 5, wherein the number of loads D is greater than or equal to 2, the number of capacitors E in the first set of capacitors is equal to D−1, and the number of capacitors F in the second set of capacitors is the same as the number of loads D.

7. The apparatus as defined in claim 1, wherein the derivation circuit is further configured to compare the detected voltage signal with a predefined voltage signal, and wherein derivation of the status of the load circuit by the derivation circuit is further based on a difference between the detected voltage signal and the predefined voltage signal.

8. The apparatus as defined in claim 1, wherein the capacitance calculated by the derivation circuit is an instantaneous capacitance of the capacitance circuit in combination with the load circuit.

9. The apparatus as defined in claim 1, wherein the first set of capacitors have substantially the same capacitive values.

10. The apparatus as defined in claim 1, wherein the time interval starts from a first moment of starting to receive the current signal from the current source and ends at a second moment when either the current signal going through the load circuit is stable or a fixed interval of time has elapsed from the first moment.

11. A device comprising the apparatus as defined in claim 1 and further comprising the load circuit, wherein the first and second terminals are coupled to the load circuit, the second contacts of the first set of capacitors are coupled to the respective interconnections between the at least D number of loads, and wherein each of the D number of loads comprises a light emitting diode circuit.

12. The device as defined in claim 11 further comprising the current source, wherein the current source is an LED driver and the current signal has a substantially constant value over time.

13. The device as defined in claim 11, wherein the device is a lamp.

14. The apparatus as defined in claim 1, wherein the derivation circuit is further configured to locate, based on a position of the step or sizes of steps in the calculated capacitance over time, at least one load from the at least D number of loads that is associated with the failure status.

15. The apparatus as defined in claim 1, wherein calculation of the capacitance by the derivation circuit is further based at least on a value of the current signal using the equation $C=I/(dV/dt)$, where C is the calculated capacitance, I is the value of the current signal, dV is a change in the voltage signal detected by the detection circuit over the time interval, and dt is the time interval.

16. The apparatus as defined in claim 1, wherein the same one of the first and second terminals that the first contacts of the first set of capacitors are coupled to is the second terminal.

17. A method for determining a status of a load circuit, which load circuit comprises at least D number of loads in a series combination, the method comprising the steps of:
receiving a current signal from a current source at a first terminal;
returning the current signal back to the current source through a second terminal, the load circuit being coupled between the first and second terminals, and a capacitance circuit comprising a set of capacitors having at least E number of capacitors each having first and second contacts, wherein the first contacts of the set of capacitors are coupled to a same one of the first and second terminals, and the second contacts of the set of capacitors are configured to be coupled to respective interconnections between the at least D number of loads;
detecting a voltage signal present between the first and second terminals in a time interval;
calculating, based at least on the detected voltage signal, the time interval, and a value of the current signal, a capacitance of the load circuit in combination with the capacitance circuit;
examining vertical jumps in the calculated capacitance over time; and
deriving the status of the load circuit based at least on examination of the vertical jumps, based on comparing the vertical jumps with a previously calculated threshold jump value, wherein when the size of the vertical jump in the calculated capacitance over time is smaller than the threshold jump by a first minimal amount or larger than the threshold jump by a second minimal amount, then the status of the load circuit is a failure status.

18. The method of claim 17, wherein the status of the load circuit comprises a status of at least one load from the at least D number of loads, the status of the at least one load comprising a normal status or the failure status.

19. The method of claim 18, wherein the normal status defines that the at least one load has an impedance value between a lower threshold value and an upper threshold value, and the failure status defines that the at least one load has an impedance value smaller than the lower threshold value or larger than the upper threshold value.

20. The method of claim 17, wherein the number of loads D is greater than or equal to 2, and the number of capacitors E in the first set of capacitors is equal to D−1.

21. The method of claim 17, further comprising comparig the detected voltage signal with a predefined voltage signal, and wherein derivation of the status of the load circuit is further based on a difference between the detected voltage signal and the predefined voltage signal.

22. The method of claim 17, wherein the calculated capacitance is an instantaneous capacitance of the capacitance circuit in combination with the load circuit.

23. The method of claim 17, wherein the detecting the voltage signal present between the first and second terminals in the time interval starts from a first moment of starting to receive the current signal from the current source and ends at a second moment when either the current signal going through the load circuit is stable or a fixed interval of time has elapsed from the first moment.

24. The method of claim 17 further comprising emitting light from the load circuit, wherein the first and second terminals are coupled to the load circuit, the second contacts of the first set of capacitors are coupled to the respective interconnections between the at least D number of loads, and wherein each of the D number of loads comprises a light emitting diode circuit.

25. The method of claim 17 wherein the current signal received from the current source is an LED driver and the current signal has a substantially constant value over time.

26. The method of claim 17, wherein the method is performfed by a lamp.

27. The method of claim 17, further comprising locating, based on a position of the vertical jumps in the calculated capacitance over time, at least one load from the at least D number of loads that is associated with the failure status.

28. The method of claim 17, wherein calculating the capacitance is further based at least on the value of the current signal using the equation $C=I/(dV/dt)$, where C is the calculated capacitance, I is the value of the current signal, dV is a change in the voltage signal detected by the detection circuit over the time interval, and dt is the time interval.

* * * * *